United States Patent [19]
Hause et al.

[11] Patent Number: 6,114,229
[45] Date of Patent: *Sep. 5, 2000

[54] POLYSILICON GATE ELECTRODE CRITICAL DIMENSION AND DRIVE CURRENT CONTROL IN MOS TRANSISTOR FABRICATION

[75] Inventors: Frederick N. Hause, Austin; Mark I. Gardner, Cedar Creek; Charles E. May, Austin, all of Tex.

[73] Assignee: Advanced Micro Devices, Inc., Houston, Tex.

[*] Notice: This patent issued on a continued prosecution application filed under 37 CFR 1.53(d), and is subject to the twenty year patent term provisions of 35 U.S.C. 154(a)(2).

[21] Appl. No.: 09/196,845
[22] Filed: Nov. 20, 1998
[51] Int. Cl.[7] .......................... H01L 21/20; H01L 21/36; H01L 21/3205; H01L 21/4763; H01L 21/44
[52] U.S. Cl. .......................... 438/585; 438/488; 438/684
[58] Field of Search ..................... 438/197, 405, 438/514, 585, 964, 530, 488, 684

[56] References Cited

U.S. PATENT DOCUMENTS 5,663,090  9/1997  Dennison .................. 438/398
5,843,812  12/1998  Hwang ..................... 438/197
6,037,233  3/2000  Liu ........................ 438/304

OTHER PUBLICATIONS

Tsutomo Sato et al., "Trench Transformation Technology using Hydrogen Annealing for Realizing Highly Reliable Device Structure with Thin Dielectric Films" 1998 Symposium on VLSI Technologies; Honolulu, Hawaii, Jun. 9–11, 1998.

Primary Examiner—Chandra Chaudhari
Assistant Examiner—Nema Berezny
Attorney, Agent, or Firm—William, Morgan & Amerson

[57] ABSTRACT

A method is provided for controlling the critical dimensions of a polysilicon gate electrode, and for improving transistor drive current control. The method involves subjecting the gate structure of a transistor to a thermal treatment process in the presence of hydrogen gas. The thermal treatment process is performed subsequent to gate etching and photoresist mask removal, and provides gate electrodes having a more homogeneous linewidth, thereby improving transistor performance.

34 Claims, 4 Drawing Sheets

POLYSILICON GATE ELECTRODE CRITICAL DIMENSION AND DRIVE CURRENT CONTROL IN MOS TRANSISTOR FABRICATION

BACKGROUND OF THE INVENTION

1. Field of the Invention

This invention relates generally to semiconductor fabrication, and, more particularly, to an improved method for controlling the critical dimension of gate electrodes and the drive current in field-effect transistors.

2. Description of the Related Art

Methods for fabricating field-effect transistors, as well as their basic structures, are well known. The gate structure of such a transistor is fabricated by first forming a dielectric layer on the surface of a semiconducting substrate, followed by forming a gate conducting layer on the surface of the dielectric layer. Thereafter, the conducting layer and underlying dielectric layer are patterned by any one of a variety of suitable photolithographic and etching processes to form a transistor gate structure comprised of a gate electrode and gate dielectric. A plurality of source/drain regions are then formed in the substrate adjacent the sides of the gate structure. Typically, the source/drain regions are formed by an ion implantation process that introduces a p-type or n-type dopant material, for example, boron, phosphorus, arsenic, or the like, into the source/drain regions.

As transistor geometries continue to shrink, controlling the critical dimensions of gate structures can be difficult. FIG. 1 illustrates a polysilicon gate structure 19 produced according to a prior art fabrication process. The gate structure 19 is comprised of a polysilicon gate electrode 16 and an underlying gate dielectric 14 formed above the surface of a semiconducting substrate 10 in an active area defined by field oxide 12. After the polysilicon gate electrode 16 is formed, the sidewall surfaces 18 of the gate electrode 16 typically have a roughened, scallop-like appearance, as depicted in FIG. 2. Unfortunately, this roughness on the sidewalls 18 of the gate electrode 16 can adversely impact transistor performance characteristics, for example, by increasing transistor leakage current. Leakage current is believed to result from a scattering effect that occurs as electrons traverse the channel between the source and drain regions of a device. As device geometries continue to shrink, and as the number of devices within a single integrated circuit increases, leakage current can become significant enough to raise the temperature of the semiconductor substrate, thereby slowing the device, and, possibly, raising the temperature of the device above the its operational limit.

The present invention is directed to overcoming, or at least reducing the effects of, some or all of the aforementioned problems.

SUMMARY OF THE INVENTION

A method for controlling the critical dimensions and the drive current of field-effect transistor gate structures is provided. Localized variations in gate conductor width can adversely impact transistor characteristics. Therefore, in accordance with one embodiment of the present invention, a method is provided for fabricating a transistor device, wherein a dielectric layer is formed above the surface of a semiconducting substrate, and a conductive gate layer is formed above the dielectric layer. The conductive gate layers are patterned by any of a number of available photolithographic and etching techniques to form a gate structure. Thereafter, the gate structure is subjected to a thermal treatment process in a hydrogen-containing atmosphere in order to reduce the degree of roughness along the sidewalls of the gate electrode. According to this process, a gate electrode is fabricated which has a more homogeneous linewidth, thereby providing improved transistor performance.

BRIEF DESCRIPTION OF THE DRAWINGS

The invention may be understood by reference to the following description taken in conjunction with the accompanying drawings, in which like reference numerals identify like elements, and in which.

Figure 1:
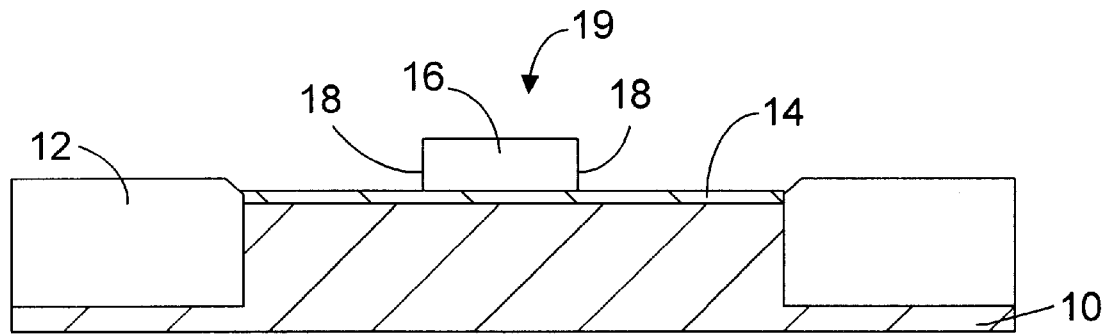
FIG. 1 is a partial cross-sectional view illustrating a prior art field effect transistor structure at an intermediate stage of fabrication.
Figure 2:
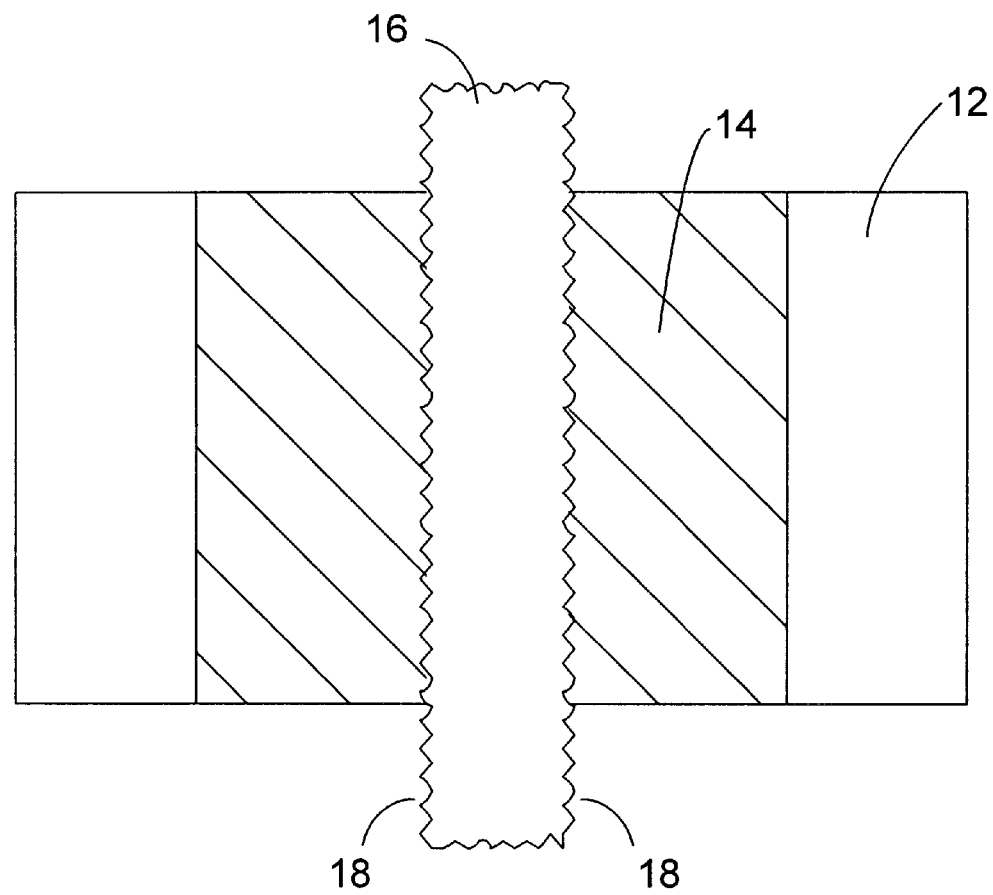
FIG. 2 is a top view of the transistor structure depicted in FIG. 1 illustrating the roughness present along the sidewall surfaces of a polysilicon gate electrode after gate etching.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

The present invention broadly concerns a method for the fabrication of an integrated circuit. In the interest of clarity, however, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

FIGS. 3–8 depict an example of one illustrative embodiment of the present invention wherein a transistor is fabricated above a surface of a semiconducting substrate. It should be noted, however, that the drawings are in a greatly simplified form, and are not intended to be inclusive of each and every step employed during the fabrication process. Features may be exaggerated, reduced, etc., relative to those dimensions on actual devices. Nevertheless, the drawings are included for the purposes of explaining illustrative embodiments of the present invention. Furthermore, in practice, the illustrated semiconductor device will be one of many supported on a common substrate and connected with suitable metallurgy in various electronic configurations.

Figure 3:
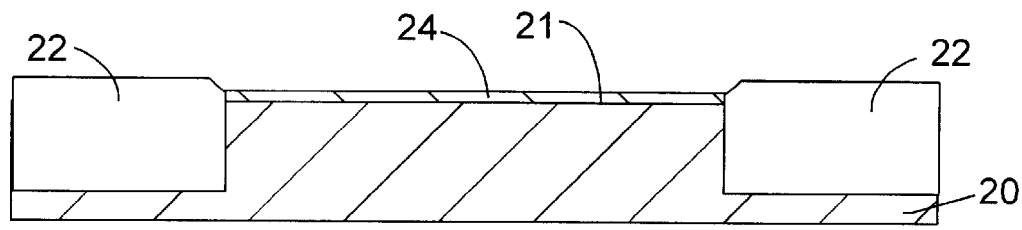
FIG. 3 is a partial cross-sectional view showing a dielectric layer formed above an active area of a semiconducting substrate.

Referring to FIG. 3, the process first comprises forming a gate dielectric layer 24 above a surface 21 of a semiconducting substrate 20 in an active area defined by field oxide regions 22. The gate dielectric layer 24 may be comprised of a variety of materials and may be formed by any of a variety of processes known in the art. For example, the gate dielectric layer 24 may be comprised of silicon dioxide formed by a thermal oxidation process at a temperature in the range of about 600–1000° C. This thermal oxidation process can be performed by any suitable technique, for example, in a batch process thermal oxidation tube, as is known in the art. Alternatively, a rapid thermal process may be used wherein the semiconducting substrate 20 is heated to an appropriate oxidizing temperature for a relatively short duration, for example, less than about 5 minutes.

Figure 4:
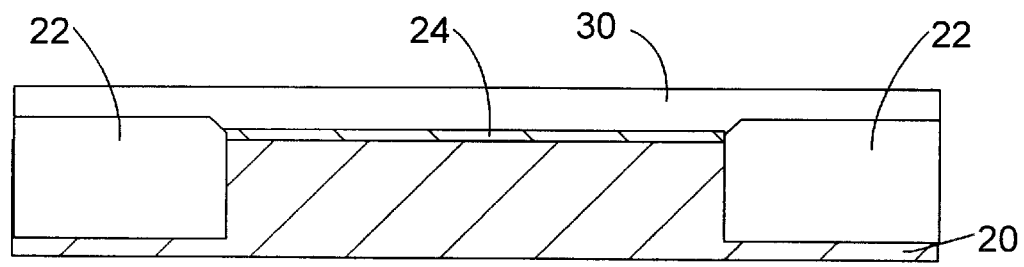
FIG. 4 illustrates a processing step subsequent to that described in FIG. 3 in which a conductive layer is formed above the surface of the dielectric layer.

Turning next to FIG. 4, a conductive gate layer 30 is next formed above the gate dielectric layer 24. The composition of conductive gate layer 30 is not specifically restricted, nor is the method by which it is formed. In one illustrative embodiment, the conductive gate layer 30 is comprised of polysilicon, formed, for example, by a chemical vapor deposition (CVD) process. Alternatively, the conductive gate layer 30 may be comprised of a composite of polysilicon with one or more other suitable materials. A dopant material, such as arsenic or boron, is generally introduced into the polysilicon in order to effect the desired conductive properties. Introduction of dopant materials is well known and is generally achieved by ion implantation processes.

Figure 5:
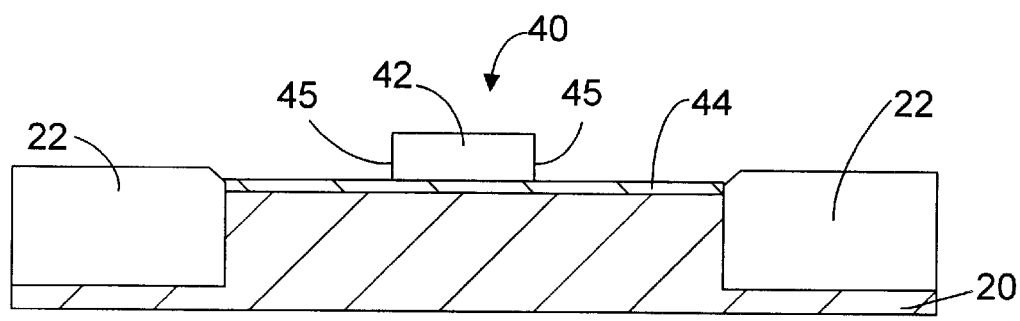
FIG. 5 illustrates a processing step subsequent to the step described in FIG. 4 in which the conductive layer is patterned so as to form a gate structure.
Figure 6:
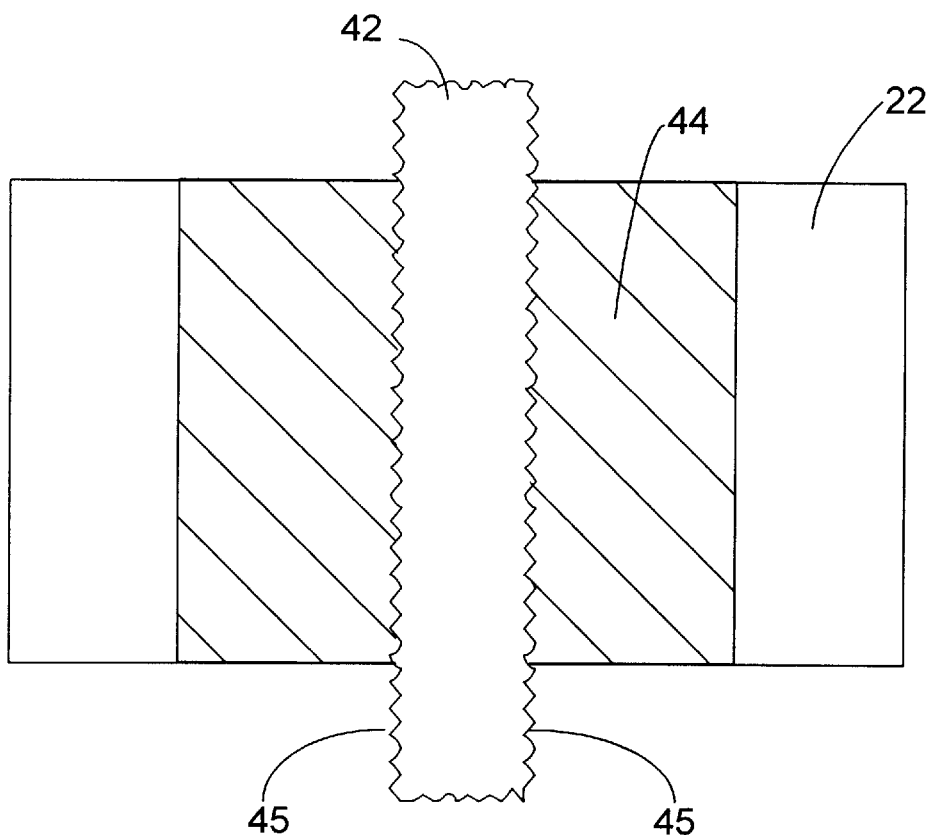
FIG. 6 is a top view of the structure depicted in FIG. 5 illustrating the roughness present along the sidewall surfaces of the polysilicon gate electrode after gate etching.

The gate conductive layer 30 and the gate dielectric layer 24 (FIG. 4) are patterned by any one of a variety of conventional photolithographic and etching processes so as to form a gate structure 40 comprising a gate electrode 42 and a gate dielectric 44, as shown in FIG. 5. Following the etching process which defines the gate structure 40, the gate electrode 42 has sidewalls 45 which are undesirably rough and scallop-like along their surfaces, as represented in FIG. 6. This roughness may be caused by a number of factors, including the photoresist pattern transfer and etching processes used to form the gate structure 40, and/or the grain-like structure of polysilicon material used to form the gate electrode 42.

Figure 7:
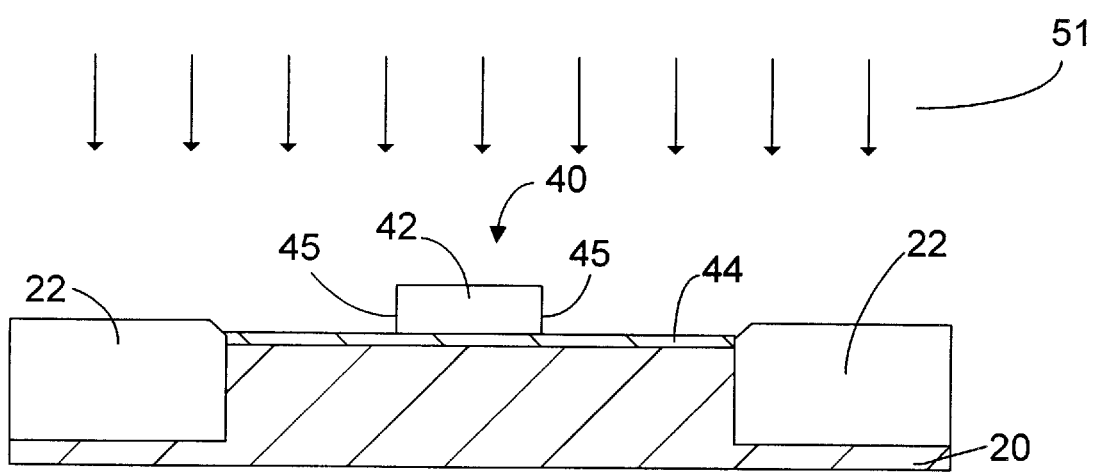
FIG. 7 represents a processing step subsequent to the step described in FIGS. 5 and 6, in which the gate structure is exposed to a thermal treatment process in an atmosphere containing hydrogen gas.

Turning next to FIG. 7, after the gate structure 40 has been etched and the photoresist masking material removed, the gate electrode 42 is subjected to a thermal treatment process in an atmosphere containing hydrogen gas ($H_2$) and/or other like gases, as indicated by arrows 51. The hydrogen gas is provided in the thermal treatment process under conditions effective for reducing the degree of roughness present along the sidewalls 45 of the gate electrode 42. The concentrations, temperatures, pressures, and other conditions suitable and/or desired for use in the thermal treatment process according to this invention may be readily identified by an individual skilled in the art. Such conditions may vary widely depending on the particular application, while still achieving the desired reduction in the surface roughness along the sidewalls 45 of the gate electrode 42.

In one illustrative embodiment of the invention, the thermal treatment step is performed at a temperature in the range of about 850° C. to about 1100° C. The hydrogen gas will typically be present in the thermal treatment process of this invention at a concentration in the range of about 1% to about 10% (by volume) of a gas flow used in the thermal treatment step, the remainder of the gas flow comprising an inert gas, such as nitrogen, argon, or other like gases, or combinations thereof. The pressure of the atmosphere in which the thermal treatment step is performed may vary, but will typically be in the range of about 1 millitorr to about 100 torr, more typically in the range of about 1 torr to about 20 torr.

Figure 8:
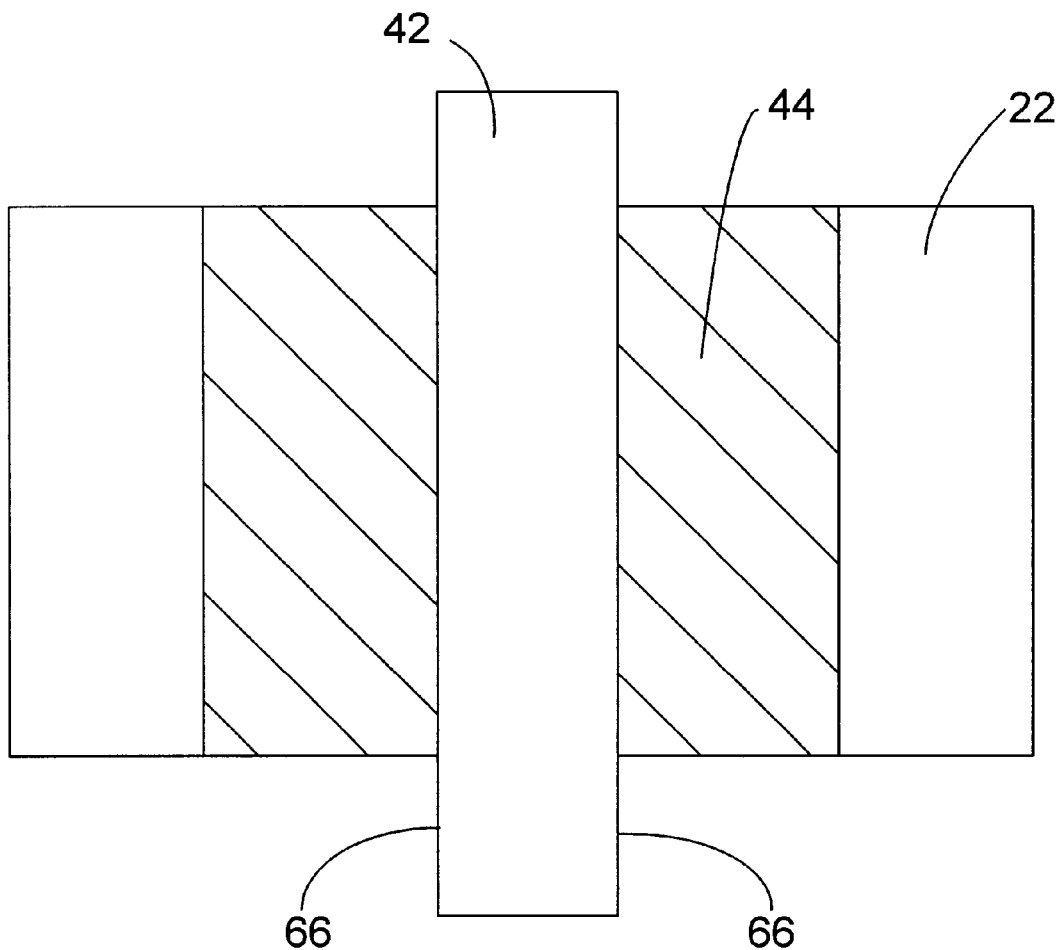
FIG. 8 represents a top view of the gate structure that results subsequent to the thermal treatment step depicted in FIG. 7.

As a result of the thermal treatment process of this invention, the degree of roughness on the surfaces of the sidewalls 45 of the gate electrode 42 are substantially reduced, resulting in a gate electrode 42 having smooth sidewall surfaces 66, as represented in FIG. 8. By reducing the roughness along the gate electrode sidewalls, a more homogeneous gate linewidth is achieved, thereby providing reduced leakage current and improved transistor performance.

Following the thermal treatment process, the remaining operations necessary to complete fabrication of the device are not specifically restricted and can be performed by essentially any of the numerous conventional techniques known and available in the art. For example, a suitable dopant material is typically introduced adjacent the gate structure 40 to form doped source/drain regions. In a subsequent step, one or more insulating oxide layers are generally provided above the surface of the device. It is through the oxide layer(s) that contact holes are subsequently formed and filled with a conducting material in order to connect the source, drain, and gate electrode of the transistor.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be readily altered or modified such that this invention can be practiced in combination with the many known variations used for fabricating transistors which employ polysilicon gate structures. All such variations are considered within the scope and spirit of the invention. Accordingly, the protection sought herein is as set forth in the claims below.

What is claimed:

1. A semiconductor fabrication process, comprising:
   providing a semiconducting substrate, said substrate having a surface;
   forming a dielectric layer above the surface of said substrate;
   forming a conductive layer above said dielectric layer;
   patterning said dielectric layer and said conducting layer to form a gate structure having at least one sidewall; and,
   exposing said gate structure to a thermal treatment process in an atmosphere comprising hydrogen gas, wherein no metal is deposited onto the gate structure during the the thermal treatment process, reducing roughness on the at least one sidewall.

2. The method of claim 1, wherein exposing said gate structure to a thermal treatment process in an atmosphere comprising hydrogen gas comprises exposing said gate structure to a thermal treatment process in an atmosphere comprising hydrogen gas at a temperature in the range of about 850° C. to about 1100° C.

3. The method of claim 1, wherein exposing said gate structure to a thermal treatment process in an atmosphere comprising hydrogen gas comprises exposing said gate structure to a thermal treatment process in an atmosphere comprising about 1% to about 10% hydrogen gas.

4. The method of claim 1, wherein exposing said gate structure to a thermal treatment process in an atmosphere comprising hydrogen gas comprises exposing said gate structure to a thermal treatment process in an atmosphere comprising hydrogen gas, wherein said atmosphere further comprises an inert gas.

5. The method of claim 1, wherein exposing said gate structure to a thermal treatment process in an atmosphere comprising hydrogen gas comprises exposing said gate structure to a thermal treatment process in an atmosphere comprising hydrogen gas, wherein said atmosphere further comprises nitrogen gas or argon gas.

6. The method of claim 1, wherein exposing said gate structure to a thermal treatment process in an atmosphere comprising hydrogen gas comprises exposing said gate structure to a thermal treatment process in an atmosphere having a pressure of about 1 millitorr to about 100 torr.

7. The method of claim 1, wherein exposing said gate structure to a thermal treatment process in an atmosphere comprising hydrogen gas comprises exposing said gate structure to a thermal treatment process in an atmosphere having a pressure of about 1 torr to about 20 torr.

8. The method of claim 1, wherein exposing said gate structure to a thermal treatment process in an atmosphere comprising hydrogen gas comprises exposing said gate structure to a thermal treatment process at a temperature in the range of about 850° C. to about 1100° in an atmosphere comprising about 1% to about 10% hydrogen gas, said atmosphere having a pressure of about 1 torr to about 20 torr.

9. The method of claim 1, wherein forming a dielectric layer above the surface of said substrate comprises forming a layer of silicon dioxide above the surface of the substrate.

10. The method of claim 9, wherein forming a layer of silicon dioxide above the surface of said substrate comprises forming a layer of silicon dioxide above the surface of said substrate by a thermal oxidation process.

11. The method of claim 10, wherein forming a layer of silicon dioxide above the surface of said substrate by a thermal oxidation process comprises forming a layer of silicon dioxide above the surface of said substrate by a thermal oxidation process performed at a temperature in the range of about 850° C. to about 1000° C.

12. The method of claim 1, wherein forming a conductive layer above said dielectric layer comprises forming a conductive layer of polysilicon above said dielectric layer.

13. The method of claim 12, wherein forming a conductive layer of polysilicon above said dielectric layer comprises forming a conductive layer of polysilicon above said dielectric layer by a chemical vapor deposition process.

14. A semiconductor fabrication process, comprising:
providing a semiconducting substrate, said substrate having a surface;
forming a dielectric layer above the surface of said substrate;
forming a conductive layer above said dielectric layer;
patterning said dielectric layer and said conducting layer to form a gate structure having at least one sidewall; and,
exposing said gate structure to a thermal treatment process at a temperature in the range of about 850° C. to about 1100° C. in an atmosphere comprising hydrogen gas, wherein no metal is deposited onto the gate structure during the thermal treatment process, reducing roughness on the at least one sidewall.

15. The method of claim 14, wherein exposing said gate structure to a thermal treatment process at a temperature in the range of about 850° C. to about 1100° C. in an atmosphere comprising hydrogen gas comprises exposing said gate structure to a thermal treatment process at a temperature in the range of about 850° C. to about 1100° C. in an atmosphere comprising about 1% to about 10% hydrogen gas.

16. The method of claim 14, wherein exposing said gate structure to a thermal treatment process at a temperature in the range of about 850° C. to about 1100° C. in an atmosphere comprising hydrogen gas comprises exposing said gate structure to a thermal treatment process at a temperature in the range of about 850° C. to about 1100° C. in an atmosphere comprising hydrogen gas, wherein said atmosphere further comprises an inert gas.

17. The method of claim 14, wherein exposing said gate structure to a thermal treatment process at a temperature in the range of about 850° C. to about 1100° C. in an atmosphere comprising hydrogen gas comprises exposing said gate structure to a thermal treatment process at a temperature in the range of about 850° C. to about 1100° C. in an atmosphere comprising hydrogen gas, wherein said atmosphere further comprises nitrogen gas or argon gas.

18. The method of claim 14, wherein exposing said gate structure to a thermal treatment process at a temperature in the range of about 850° C. to about 1100° C. in an atmosphere comprising hydrogen gas comprises exposing said gate structure to a thermal treatment process at a temperature in the range of about 850° C. to about 1100° C. in an atmosphere having a pressure of about 1 millitorr to about 100 torr.

19. The method of claim 14, wherein exposing said gate structure to a thermal treatment process at a temperature in the range of about 850° C. to about 1100° C. in an atmosphere comprising hydrogen gas comprises exposing said gate structure to a thermal treatment process at a temperature in the range of about 850° C. to about 1100° C. in an atmosphere having a pressure of about 1 torr to about 20 torr.

20. The method of claim 14, wherein forming a dielectric layer above the surface of said substrate comprises forming a layer of silicon dioxide above the surface of the substrate.

21. The method of claim 20, wherein forming a layer of silicon dioxide above the surface of said substrate comprises forming a layer of silicon dioxide above the surface of said substrate by a thermal oxidation process.

22. The method of claim 20, wherein forming a layer of silicon dioxide above the surface of said substrate by a thermal oxidation process comprises forming a layer of silicon dioxide above the surface of said substrate by a thermal oxidation process performed at a temperature in the range of about 850° C. to about 1000° C.

23. The method of claim 14, wherein forming a conductive layer above said dielectric layer comprises forming a conductive layer of polysilicon above said dielectric layer.

24. The method of claim 23, wherein forming a conductive layer of polysilicon above said dielectric layer comprises forming a conductive layer of polysilicon above said dielectric layer by a chemical vapor deposition process.

25. A semiconductor fabrication process, comprising:
providing a semiconducting substrate, said substrate having a surface;
forming a dielectric layer above the surface of said substrate;

forming a conductive layer above said dielectric layer;

patterning said dielectric layer and said conducting layer to form a gate structure having at least one sidewall; and, exposing said gate structure to a thermal treatment process at a temperature in the range of about 850° C. to about 1100° C. in an atmosphere comprising about 1% to about 10% hydrogen gas, wherein no metal is deposited onto the gate structure during the thermal treatment process, reducing roughness on the at least one sidewall.

26. The method of claim 25, wherein exposing said gate structure to a thermal treatment process at a temperature in the range of about 850° C. to about 1100° C. in an atmosphere comprising about 1% to about 10% hydrogen gas comprises exposing said gate structure to a thermal treatment process at a temperature in the range of about 850° C. to about 1100° C. in an atmosphere comprising about 1% to about 10% hydrogen gas, wherein said atmosphere further comprises an inert gas.

27. The method of claim 25, wherein exposing said gate structure to a thermal treatment process at a temperature in the range of about 850° C. to about 1100° C. in an atmosphere comprising about 1% to about 10% hydrogen gas comprises exposing said gate structure to a thermal treatment process at a temperature in the range of about 850° C. to about 1100° C. in an atmosphere comprising about 1% to about 10% hydrogen gas, wherein said atmosphere further comprises nitrogen gas or argon gas.

28. The method of claim 25, wherein exposing said gate structure to a thermal treatment process at a temperature in the range of about 850° C. to about 1100° C. in an atmosphere comprising about 1% to about 10% hydrogen gas comprises exposing said gate structure to a thermal treatment process at a temperature in the range of about 850° C. to about 1100° C. in an atmosphere comprising about 1% to about 10% hydrogen gas, said atmoshphere having a pressure of about 1 millitorr to about 100 torr.

29. The method of claim 25, wherein exposing said gate structure to a thermal treatment process at a temperature in the range of about 850° C. to about 1100° C. in an atmosphere comprising about 1% to about 10% hydrogen gas comprises exposing said gate structure to a thermal treatment process at a temperature in the range of about 850° C. to about 1100° C. in an atmosphere comprising about 1% to about 10% hydrogen gas, said atmoshphere having a pressure of about 1 torr to about 20 torr.

30. The method of claim 25, wherein forming a dielectric layer above the surface of said substrate comprises forming a layer of silicon dioxide above the surface of the substrate.

31. The method of claim 25, wherein forming a layer of silicon dioxide above the surface of said substrate comprises forming a layer of silicon dioxide above the surface of said substrate by a thermal oxidation process.

32. The method of claim 31, wherein forming a layer of silicon dioxide above the surface of said substrate by a thermal oxidation process comprises forming a layer of silicon dioxide above the surface of said substrate by a thermal oxidation process performed at a temperature in the range of about 850° C. to about 1000° C.

33. The method of claim 25, wherein forming a conductive layer above said dielectric layer comprises forming a conductive layer of polysilicon above said dielectric layer.

34. The method of claim 33, wherein forming a conductive layer of polysilicon above said dielectric layer comprises forming a conductive layer of polysilicon above said dielectric layer by a chemical vapor deposition process.

* * * * *